(12) United States Patent
Kang et al.

(10) Patent No.: US 12,283,953 B2
(45) Date of Patent: Apr. 22, 2025

(54) INVERTER INCLUDING TRANSISTORS HAVING DIFFERENT THRESHOLD VOLTAGES AND MEMORY CELL INCLUDING THE SAME

(71) Applicant: POSTECH RESEARCH AND BUSINESS DEVELOPMENT FOUNDATION, Pohang-si (KR)

(72) Inventors: Seokhyeong Kang, Pohang-si (KR); Youngchang Choi, Pohang-si (KR); Sunmean Kim, Pohang-si (KR); Kyongsu Lee, Pohang-si (KR)

(73) Assignee: Postech Research and Business Development Foundation, Gyeonsangbuk-do (KR)

( * ) Notice: Subject to any disclaimer, the term of this patent is extended or adjusted under 35 U.S.C. 154(b) by 331 days.

(21) Appl. No.: 18/060,223

(22) Filed: Nov. 30, 2022

(65) Prior Publication Data

US 2023/0170907 A1 Jun. 1, 2023

(30) Foreign Application Priority Data

Nov. 30, 2021 (KR) .................. 10-2021-0168696
Oct. 18, 2022 (KR) .................. 10-2022-0134349

(51) Int. Cl.
*H03K 19/094* (2006.01)
*G11C 11/41* (2006.01)
(Continued)

(52) U.S. Cl.
CPC ........ *H03K 19/09425* (2013.01); *G11C 11/41* (2013.01); *H03K 19/0185* (2013.01); *H03K 19/0944* (2013.01)

(58) Field of Classification Search
CPC ................ G11C 11/41; H03K 19/0185; H03K 19/09425; H03K 19/0944
See application file for complete search history.

(56) References Cited

U.S. PATENT DOCUMENTS 7,733,128 B2 * 6/2010 Miura ................. H04L 25/0282
326/86
8,390,315 B1 * 3/2013 Wang ............. H03K 19/018571
326/26
(Continued)

FOREIGN PATENT DOCUMENTS

KR 101928223 B1 12/2018

OTHER PUBLICATIONS

Youngchang Choi et al., "Design and Analysis of a Low-Power Ternary SRAM", IEEE, 2021.

*Primary Examiner* — Kurtis R Bahr
(74) *Attorney, Agent, or Firm* — Harness, Dickey & Pierce, P.L.C.

(57) ABSTRACT

Disclosed is an inverter which includes a first P-MOS transistor connected between a node receiving a drain voltage and a first path node and operated based on an input voltage, a first N-MOS transistor connected between the first path node and an output terminal outputting an output voltage and operated based on the drain voltage, a second P-MOS transistor connected between the output terminal and a second path node and operated based on a ground voltage, a second N-MOS transistor connected between the second path node and a node receiving the ground voltage and operated based on the input voltage, a third P-MOS transistor connected between the first path node and the second path node and operated based on the input voltage, and a third N-MOS transistor connected between the first path node and the second path node and operated based on the input voltage.

14 Claims, 13 Drawing Sheets

(51) Int. Cl.
*H03K 19/0185* (2006.01)
*H03K 19/0944* (2006.01)

(56) References Cited

U.S. PATENT DOCUMENTS

| | | | |
|---|---|---|---|
| 11,567,522 B2* | 1/2023 | Chang | G05F 1/618 |
| 2018/0191350 A1* | 7/2018 | Jiang | H03K 19/0948 |

* cited by examiner

INVERTER INCLUDING TRANSISTORS HAVING DIFFERENT THRESHOLD VOLTAGES AND MEMORY CELL INCLUDING THE SAME

CROSS-REFERENCE TO RELATED APPLICATIONS

This application claims priority under 35 U.S.C. § 119 to Korean Patent Application No. 10-2021-0168696 filed on Nov. 30, 2021, and Korean Patent Application No. 10-2022-0134349 filed on Oct. 18, 2022, in the Korean Intellectual Property Office, the disclosures of each of which are incorporated by reference herein in their entireties.

BACKGROUND

Embodiments of the present disclosure described herein relate to an inverter, and more particularly, relate to an inverter including transistors having different threshold voltages and a memory cell including the same.

A multi-valued logic (MVL) system may be a solution to overcome a dimensional down-scaling issue in a conventional binary logic system. The multi-valued logic system may implement a functional block by using a logic gate. Because the multi-valued logic system has a higher implementation order of logic gates compared to the binary logic system, a silicon area of a routing wire may be reduced and power consumption may be reduced. For the completeness of a ternary digital system such as a ternary microprocessor, the implementation of a storage component such as a ternary static random access memory is highly recommended.

SUMMARY

Embodiments of the present disclosure provide an inverter including transistors having different threshold voltages and a memory cell including the same.

According to an embodiment, an inverter includes a first P-MOS transistor that is connected between a node receiving a drain voltage and a first path node and operates based on an input voltage, a first N-MOS transistor that is connected between the first path node and an output terminal outputting an output voltage and operates based on the drain voltage, a second P-MOS transistor that is connected between the output terminal and a second path node and operates based on a ground voltage, a second N-MOS transistor that is connected between the second path node and a node receiving the ground voltage and operates based on the input voltage, a third P-MOS transistor that is connected between the first path node and the second path node and operates based on the input voltage, and a third N-MOS transistor that is connected between the first path node and the second path node and operates based on the input voltage. The first P-MOS transistor has a first threshold voltage, each of the second P-MOS transistor and the third P-MOS transistor has a second threshold voltage higher than the first threshold voltage, the second N-MOS transistor has a third threshold voltage, and each of the first N-MOS transistor and the third N-MOS transistor has a fourth threshold voltage higher than the third threshold voltage.

According to an embodiment, a memory cell includes a first inverter that includes an input terminal connected with a first storage node and an output terminal connected with a second storage node, a second inverter that includes an output terminal connected with the first storage node and an input terminal connected with the second storage node, a first access transistor that is connected between the first storage node and a first treat line, and a second access transistor that is connected between the second storage node and a second treat line. The first inverter includes a first P-MOS transistor of a first type that is connected between a node receiving a drain voltage and a first path node and operates based on an input voltage input to the input terminal, a first N-MOS transistor of a second type that is connected between the first path node and the output terminal outputting an output voltage and operates based on the drain voltage, a second P-MOS transistor of the second type that is connected between the output terminal and a second path node and operates based on a ground voltage, a second N-MOS transistor of the first type that is connected between the second path node and a node receiving the ground voltage and operates based on the input voltage, a third P-MOS transistor of the second type that is connected between the first path node and the second path node and operates based on the input voltage, and a third N-MOS transistor of the second type that is connected between the first path node and the second path node and operates based on the input voltage. A first threshold voltage of each of the first P-MOS transistor, the second N-MOS transistor corresponding to the first type is lower than a second threshold voltage of each of the first N-MOS transistor, the second P-MOS transistor, the third P-MOS transistor, and the third N-MOS transistor corresponding to the second type.

BRIEF DESCRIPTION OF THE FIGURES

The above and other objects and features of the present disclosure will become apparent by describing in detail embodiments thereof with reference to the accompanying drawings.

DETAILED DESCRIPTION

In embodiments of the present disclosure, specific structural or functional descriptions may be directed only to provide examples and may be changed and implemented in various forms. Accordingly, an actual implementation form is not limited to specific embodiments disclosed, and the present disclosure covers all modifications, equivalents, and alternatives falling within the spirit and scope of the invention.

The terms "first" and "second" are used to describe various elements, but it should be understood that the terms are only used to distinguish one element from another element. For example, a first element may be termed a second element; similarly, the second element may be termed the first element.

It should be understood that when any element is referred to as being "connected" or "coupled" to any other element, it can be directly connected or coupled to the other element or intervening elements may be present.

The singular forms are intended to include the plural forms unless the context clearly indicates otherwise. In the specification, it should be understood that the terms "comprises", "comprising", "includes", and/or "including" specify that described features, numbers, steps, operations, elements, or components or a combination thereof exists, but do not preclude the presence or addition of one or more other features, numbers, steps, operations, elements, or components or a combination thereof.

Unless otherwise defined, all the terms (including technical and scientific terms) used herein are to be interpreted as is customary in the art to which the invention belongs. It will be understood that terms defined in the dictionary used in general should be interpreted as is customary in the relevant art and should not be interpreted in an idealized or overly formal sense unless defined explicitly in the specification.

Below, embodiments will be described in detail with reference to the accompanying drawings. In the description given with reference to the accompanying drawings, the same elements are marked by the same reference signs regardless of signs of the drawings, and repeated descriptions thereof will be omitted.

Figure 1:
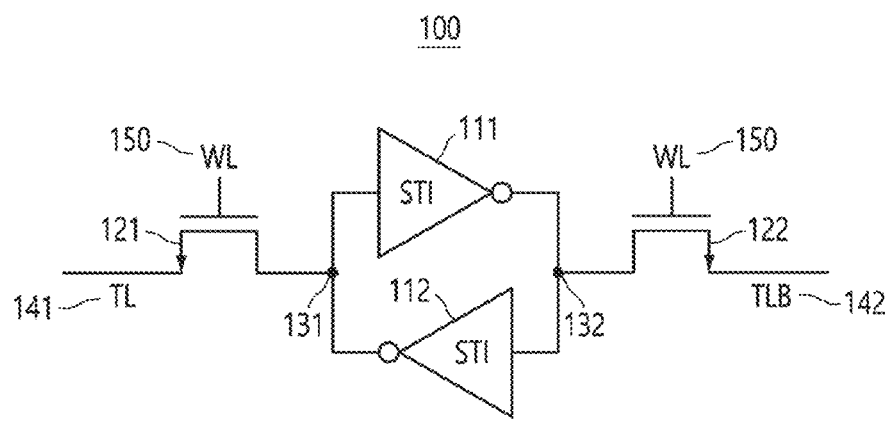
FIG. 1 is a diagram illustrating a structure of a ternary static random access memory (SRAM) cell according to an embodiment.

FIG. 1 is a diagram illustrating a structure of a ternary static random access memory (SRAM) cell according to an embodiment.

A ternary SRAM cell 100 according to an embodiment may include a first standard ternary inverter 111 and a second standard ternary inverter 112 that are connected in parallel. According to an embodiment, the first standard ternary inverter 111 and the second standard ternary inverter 112 may be connected with opposite polarities. In other words, the first standard ternary inverter 111 and the second standard ternary inverter 112 may be connected in a back-to-back manner.

According to an embodiment, the ternary SRAM cell 100 may further include a first access transistor 121 that connects a first storage node 131 between an input terminal of the first standard ternary inverter 111 and an output terminal of the second standard ternary inverter 112 with a first treat line 141. Also, the ternary SRAM cell 100 may further include a second access transistor 122 that connects a second storage node 132 between an output terminal of the first standard ternary inverter 111 and an input terminal of the second standard ternary inverter 112 with a second treat line 142.

According to an embodiment, the first access transistor 121 and the second access transistor 122 may be implemented with an n0type transistor (e.g., an N-MOS transistor), a drain of the first access transistor 121 may be connected with the first storage node 131, and a drain of the second access transistor 122 may be connected with the second storage node 132. Also, a source of the first access transistor 121 may be connected with the first treat line 141, and a source of the second access transistor 122 may be connected with a second treat line 142.

According to an embodiment, in the ternary SRAM cell 100, a gate of the first access transistor 121 and a gate of the second access transistor 122 may be connected with a word line (WL) 150.

In the ternary logic, a ground voltage Gnd, a half drain voltage $V_{DD}/2$, and a drain voltage $V_{DD}$ may respectively correspond to imbalance ternary logical values, that is, "0", "1", and "2". The ternary SRAM cell 100 according to an embodiment may use the first standard ternary inverter 111 and the second standard ternary inverter 112 connected in the back-to-back manner as a storage element. As will be described later, the ternary SRAM cell 100 may hold a voltage corresponding to one ternary value at the first storage node 131 and the second storage node 132 by a write voltage applied to the first treat line 141 and the second treat line 142.

Figure 2:
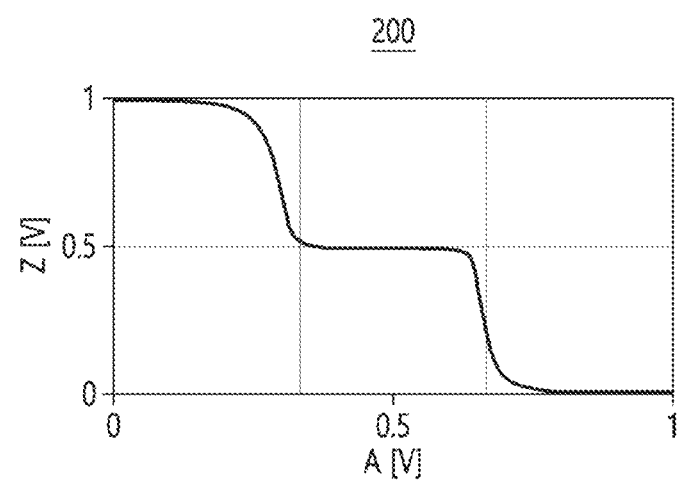
FIG. 2 is a diagram illustrating a voltage-transfer characteristic graph for a standard ternary inverter.

FIG. 2 is a diagram illustrating a voltage-transfer characteristic (VTC) graph for a standard ternary inverter (STI).

The standard ternary inverter STI may refer to a logic gate that outputs a ternary logical value of "2", "1", or "0" when a ternary logical value of "0", "1", or "2" is received. When the standard ternary inverter STI has appropriate voltage-transfer characteristics like a graph 200 illustrated in FIG. 2, the standard ternary inverter STI may obtain a margin sufficient to activate a tolerance to a noise. Herein, the margin may refer to the stability. Referring to the graph 200, when the ground voltage Gnd (e.g., 0 V) indicating the ternary value of "0" is applied to the standard ternary inverter STI, the drain voltage $V_{DD}$ (e.g., 1 V) indicating the ternary value of "2" may be output from the standard ternary inverter STI. Also, when the half drain voltage $V_{DD}/2$ (e.g., 0.5 V) indicating the ternary value of "1" is applied to the standard ternary inverter STI, the half drain voltage $V_{DD}/2$ indicating the ternary value of "1" may be output from the standard ternary inverter STI; when the drain voltage $V_{DD}$ indicating the ternary value of "2" is applied to the standard ternary inverter STI, the ground voltage Gnd indicating the ternary value of "0" may be output from the standard ternary inverter STI. For example, the drain voltage $V_{DD}$ may be 1 V, but the magnitude of the drain voltage $V_{DD}$ is not limited thereto.

Figure 3:
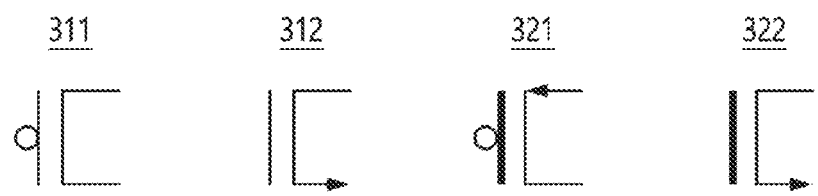
FIG. 3 is a diagram illustrating transistors included in a standard ternary inverter according to an embodiment.

FIG. 3 is a diagram illustrating transistors included in a standard ternary inverter according to an embodiment.

Upon designing the standard ternary inverter, a ternary switching operation may be implemented by using a multi-threshold CMOS technology. As the thickness of the gate oxide TOX of the transistor increases, the threshold voltage VTH of the transistor may increase. Referring to FIG. 3, four types of transistors may be used to implement the standard ternary inverter according to an embodiment. First, a transistor 311 refers to a p-type transistor (hereinafter referred to as a "P-MOS transistor") whose gate oxide has a first thickness. A transistor 312 refers to an n-type transistor (hereinafter referred to as an "N-MOS transistor") whose gate oxide has the first thickness. A transistor 321 refers to a P-MOS transistor whose gate oxide has a second thickness. A transistor 322 refers to an N-MOS transistor whose gate oxide has the second thickness. Herein, the second thickness may be thicker than the first thickness. Accordingly, the threshold voltage of the transistor with the second thickness is higher than the threshold voltage of the transistor with the first thickness.

According to an embodiment, the P-MOS transistor 311 including the gate oxide of the first thickness may be turned on when a voltage applied to the gate thereof is the ground voltage Gnd or the half drain voltage $V_{DD}/2$. In contrast, the P-MOS transistor 321 including the gate oxide of the second thickness may be turned on only when a voltage applied to the gate thereof is the ground voltage Gnd.

According to an embodiment, the N-MOS transistor 312 including the gate oxide of the first thickness may be turned on when a voltage applied to the gate thereof is the drain voltage $V_{DD}$ or the half drain voltage $V_{DD}/2$. In contrast, the N-MOS transistor 322 including the gate oxide of the second thickness may be turned on only when a voltage applied to the gate thereof is the drain voltage $V_{DD}$.

A major issue associated with the implementation of the ternary logic circuit is the amount of static current when the output voltage is the half drain voltage $V_{DD}/2$. The reason is that a current supplied from a voltage source leads to power dissipation. When the output of the standard ternary inverter is the drain voltage $V_{DD}$ or the ground voltage Gnd, the pull-up or pull-down is completed, and thus, the static current does not flow. However, when the output of the standard ternary inverter is the drain voltage $V_{DD}$, the static current partially flows. Accordingly, to reduce the power dissipation, a method of reducing a current when the output is the half drain voltage $V_{DD}/2$ should be included in designing the ternary logic circuit.

Figure 4:
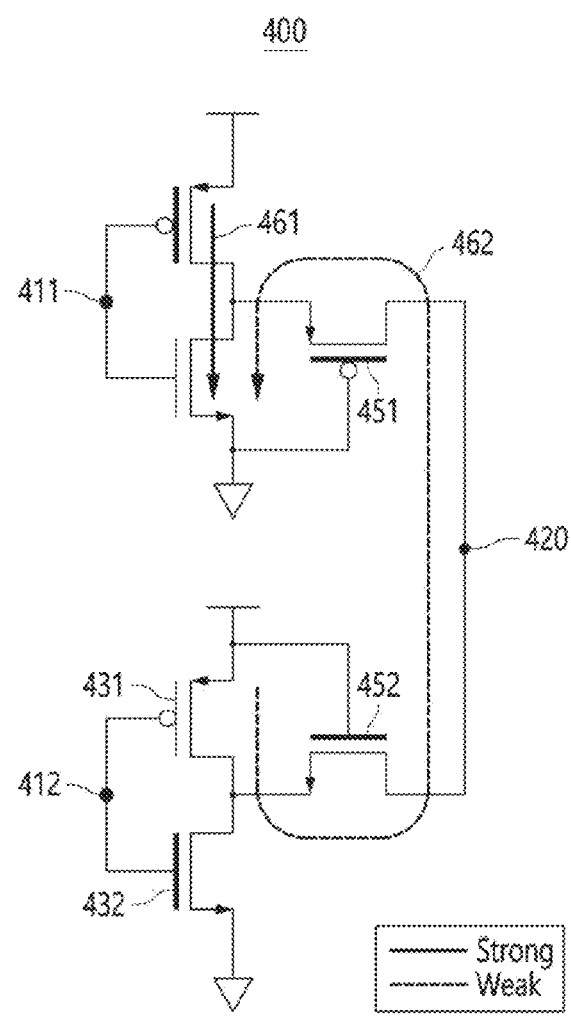
FIG. 4 is a diagram illustrating a structure of a standard ternary inverter according to a comparative embodiment.

FIG. 4 is a diagram illustrating a structure of a standard ternary inverter according to a comparative embodiment.

A conventional standard ternary inverter 400 according to the comparative embodiment may include P-MOS transistors 431 and 451 each including the gate oxide of the second thickness and N-MOS transistors 432 and 452 each including the gate oxide of the second thickness. In the specification, in the following description, a transistor including the gate oxide of the first thickness is referred to as a "first-type transistor", and a transistor including the gate oxide of the second thickness is referred to as a "second-type transistor".

When the input voltage applied to the standard ternary inverter 400 is the half drain voltage $V_{DD}/2$, theoretically, a second-type P-MOS transistor 431 and a second-type N-MOS transistor 432 connected with each of input nodes 411 and 412 are turned off. Because a second-type P-MOS transistor 451 and a second-type N-MOS transistor 452 effectively act as a high resistance, the half drain voltage $V_{DD}/2$ may be output from an output terminal 420 depending on the voltage division. Accordingly, a small current may be supplied to the standard ternary inverter 400 by the voltage source.

However, when a threshold voltage of the transistor including the gate oxide of the second thickness is not sufficiently high or the transistor exists in a sub-threshold region, even though the half drain voltage $V_{DD}/2$ is applied to the transistor, the transistor may not be completely turned off. When the input voltage applied to the standard ternary inverter is the half drain voltage $V_{DD}/2$ and the transistors 431 and 432 each including the gate oxide of the second thickness are not completely turned off, there may be provided two paths through which the output voltage is output to the output terminal 420. For example, a path 461 may refer to a path through which a strong current flows when the input voltage is the half drain voltage $V_{DD}/2$. A path 462 may refer to a path through which a weak current flows when the input voltage is the half drain voltage $V_{DD}/2$.

In the standard ternary inverter 400 according to the comparative embodiment, the path 461 through which the strong current flows may pass through the P-MOS transistor 431 that includes the gate oxide of the second thickness and is connected with the input node 411. As will be described later, compared to the standard ternary inverter 400 according to the comparative embodiment, because a strong current path passes through more transistors than the standard ternary inverter 400, the standard ternary inverter according to an embodiment has a more effective resistance, and thus, a current that is supplied from the voltage source decreases. As such, the standard ternary inverter according to an embodiment may reduce the power dissipation.

Figure 5:
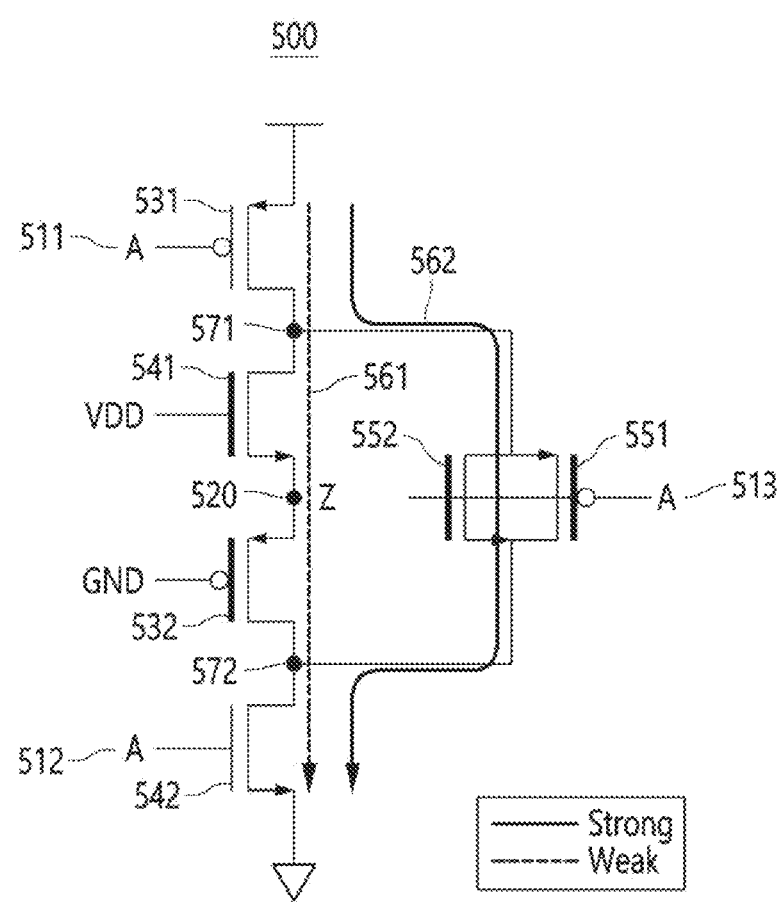
FIG. 5 is a diagram illustrating a structure of a standard ternary inverter according to an embodiment.

FIG. 5 is a diagram illustrating a structure of a standard ternary inverter 500 according to an embodiment.

Referring to FIG. 1, the ternary SRAM cell 100 according to an embodiment may include the first standard ternary inverter 111 and the second standard ternary inverter 112. The ternary SRAM cell 100 according to an embodiment may further include the first access transistor 121 and the second access transistor 122. In this case, the first standard ternary inverter 111 and the second standard ternary inverter 112 may include one or more transistors each including the gate oxide of the first thickness and one or more transistors each including the gate oxide of the second thickness thicker than the first thickness, and each of the first access transistor and the second access transistor may be a transistor including the gate oxide of the first thickness. Also, each of the first standard ternary inverter 111 and the second standard ternary inverter 112 may have a structure of the standard ternary inverter 500 illustrated in FIG. 5.

The standard ternary inverter 500 according to an embodiment may include a first P-MOS transistor 531 of the first type that receives the input voltage through a gate, and a first N-MOS transistor 541 of the second type that includes a drain connected with a drain of the first P-MOS transistor 531. Also, the standard ternary inverter 500 may further include a second P-MOS transistor 532 of the second type that includes a source connected with a source of the first N-MOS transistor 541, and a second N-MOS transistor 542 of the first type that includes a drain connected with a drain of the second P-MOS transistor 532. The standard ternary inverter 500 according to an embodiment may further include a third P-MOS transistor 551 of the second type that receives the input voltage through a gate and a third N-MOS transistor 552 of the second type that receives the input voltage through a gate, and the third P-MOS transistor 551 and the third N-MOS transistor 552 may be connected in parallel.

In the standard ternary inverter 500 according to an embodiment, the third P-MOS transistor 551 and the third N-MOS transistor 552 may be disposed between a first path node 571 connecting the first P-MOS transistor 531 and the first N-MOS transistor 541 and a second path node 572 connecting the second P-MOS transistor 532 and the second N-MOS transistor 542.

According to an embodiment, the first path node 571 may be connected with a source of the third P-MOS transistor 551 and a drain of the third N-MOS transistor 552, and the second path node 572 may be connected with a drain of the third P-MOS transistor 551 and a source of the third N-MOS transistor 552.

According to an embodiment, the output voltage may be output from an output terminal 520 with which the source of the first N-MOS transistor 541 and the source of the second P-MOS transistor 532 are connected.

According to an embodiment, the source of the third P-MOS transistor 551 and the drain of the third N-MOS transistor 552 may be connected with the first path node 571, and the drain of the third P-MOS transistor 551 and the source of the third N-MOS transistor 552 may be connected with the second path node 572.

According to an embodiment, the drain voltage $V_{DD}$ may be supplied to a source of the first P-MOS transistor 531 and a gate of the first N-MOS transistor 541, and the ground voltage Gnd may be applied to a gate of the second P-MOS transistor 532 and a source of the second N-MOS transistor 542.

Herein, the first-type transistor (e.g., the first P-MOS transistor 531 or the second N-MOS transistor 542) may have a first threshold voltage due to the gate oxide of the first thickness, and the second-type transistor (e.g., the first N-MOS transistor 541, the second P-MOS transistor 532, the third P-MOS transistor 551, or the third N-MOS transistor 552) may have a second threshold voltage due to the gate oxide of the second thickness thicker than the first thickness. The second threshold voltage may be greater than the first threshold voltage.

When the input voltage is the half drain voltage $V_{DD}/2$ and the first P-MOS transistor 531 and the second N-MOS transistor 542 each including the gate oxide of the second thickness are not completely turned off, there may be provided two paths through which the output voltage is output to the output terminal 520. A path 561 may refer to a path through which a weak current flows when the input voltage is the half drain voltage $V_{DD}/2$. A path 562 may refer to a path through which a strong current flows when the input voltage is the half drain voltage $V_{DD}/2$. In the strong current path 562 of the standard ternary inverter 500 according to an embodiment, because the third P-MOS transistor 551 and the third N-MOS transistor 552 that are connected with the input nodes 511, 512, and 513 and include the gate oxide of the second thickness effectively act as a high resistance, when the half drain voltage $V_{DD}/2$ is applied to the standard ternary inverter 500 as the input voltage, a current that is supplied by the voltage source may decrease.

Figure 6A:
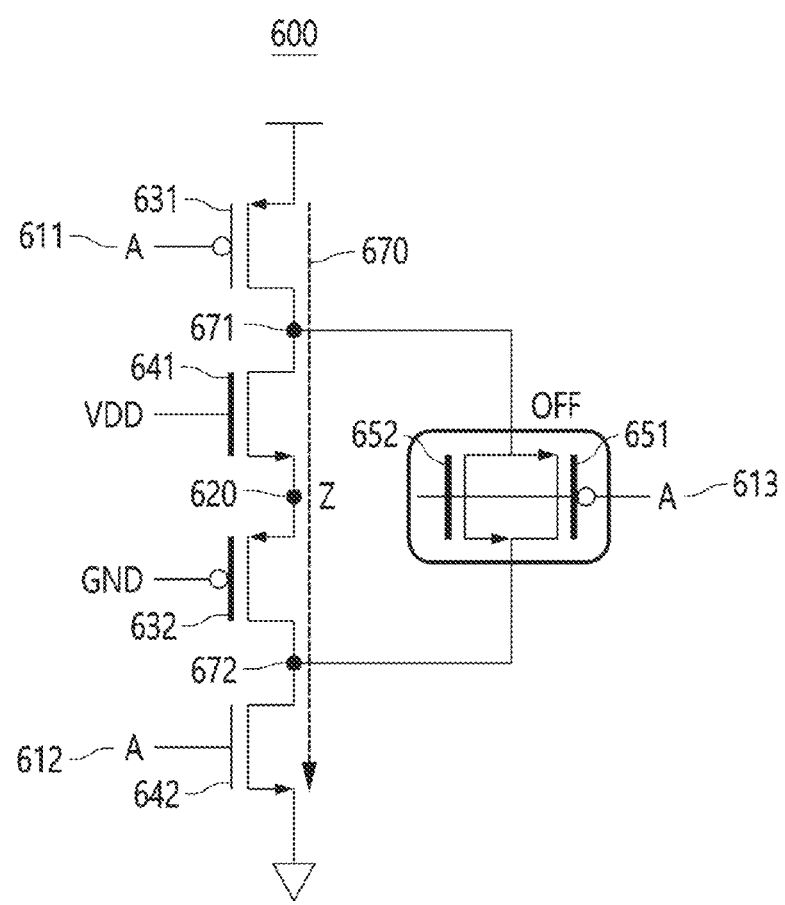
FIGS. 6A to 6C are diagrams for describing an operation mechanism of a standard ternary inverter according to an embodiment.
Figure 6B:
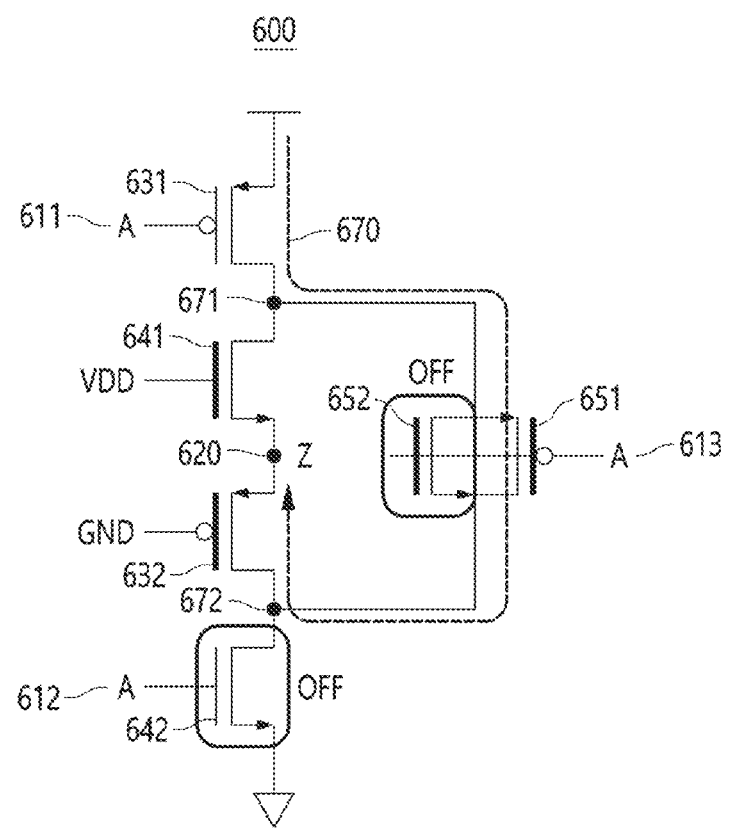
Figure 6C:
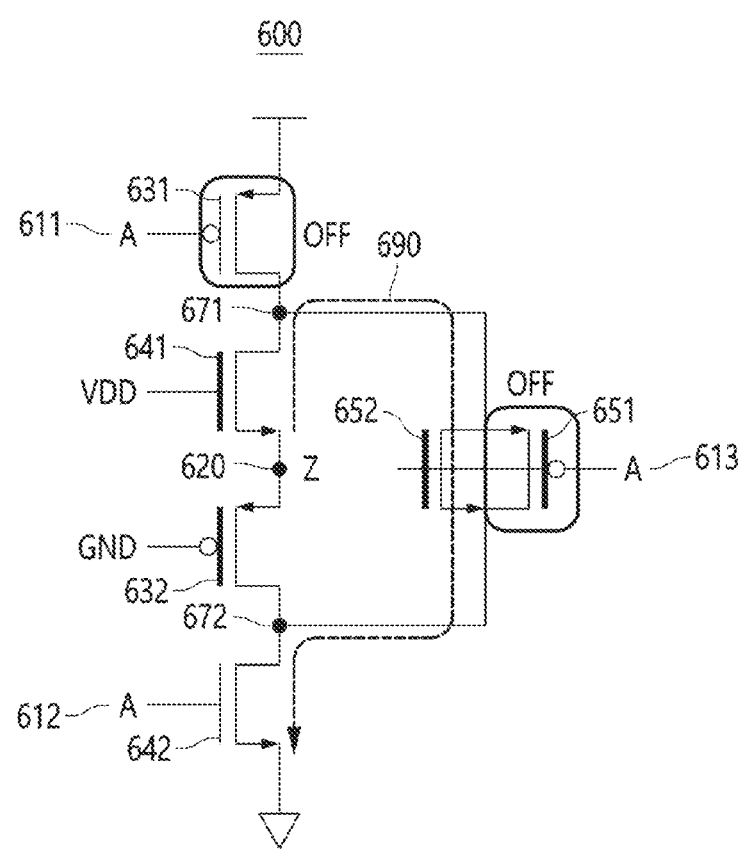

FIGS. 6A to 6C are diagrams for describing an operation mechanism of a standard ternary inverter 600 according to an embodiment.

The mechanism that the half drain voltage $V_{DD}/2$ is output as the output voltage when the half drain voltage $V_{DD}/2$ is applied to the standard ternary inverter 600 as the input voltage will be described with reference to FIG. 6A.

According to an embodiment, the half drain voltage $V_{DD}/2$ may be applied to input terminals 611, 612, and 613 of the standard ternary inverter 600. In th, as described above, because the second-type P-MOS transistor (i.e., a P-MOS transistor including the gate oxide of the second thickness) is turned on only when a voltage applied to the gate thereof is the ground voltage Gnd and the second-type N-MOS transistor (i.e., an N-MOS transistor including the gate oxide of the first thickness) is turned on only when a voltage applied to the gate thereof is the drain voltage VDD, a third P-MOS transistor 651 of the second type and a third N-MOS transistor 652 of the second type and a third N-MOS transistor 652 of the second type may be turned off. In this case, the standard ternary inverter 600 may output the half drain voltage $V_{DD}/2$ to an output terminal 620 as the output voltage along a path 760 that is formed of the first P-MOS transistor 631, the first N-MOS transistor 641, the second P-MOS transistor 632, and the second N-MOS transistor 642.

According to an embodiment, in the standard ternary inverter 600, the drain voltage $V_{DD}$ of the voltage source may be supplied to the drain of the first P-MOS transistor 631, and the ground voltage Gnd of the voltage source may be supplied to the drain of the second N-MOS transistor 642; in this case, the first N-MOS transistor 641 and the second P-MOS transistor 632 may act as the high resistance. As a result, in the standard ternary inverter 600, when the half drain voltage $V_{DD}/2$ is applied as the input voltage, the half drain voltage $V_{DD}/2$ may be output from the output terminal 620 as the output voltage depending on the voltage division that is made on the path 670.

The mechanism that the drain voltage $V_{DD}$ is output as the output voltage when the ground voltage Gnd is applied to the standard ternary inverter 600 as the input voltage will be described with reference to FIG. 6B.

According to an embodiment, the ground voltage Gnd may be applied to the input terminals 611, 612, and 613 of the standard ternary inverter 600. In this case, the third N-MOS transistor 652 of the second type and the second N-MOS transistor of the first type may be turned off. As such, the standard ternary inverter 600 may output the drain voltage $V_{DD}$ to the output terminal 620 as the output voltage along a path 670 that is formed of the first P-MOS transistor 631, the third P-MOS transistor 651, and the second P-MOS transistor 632.

In detail, the third N-MOS transistor 652 of the second type is turned off when the ground voltage Gnd is applied to the input terminal 613, and the second N-MOS transistor 642 of the first type is turned off when the ground voltage Gnd is applied to the input terminal 612. In the standard ternary inverter 600, the drain voltage $V_{DD}$ may be supplied to the source of the first P-MOS transistor 631, and the first N-MOS transistor 641 may act as the high resistance. As a result, when the ground voltage Gnd is applied as the input voltage, the standard ternary inverter 600 may output the drain voltage $V_{DD}$ to the output terminal 620 as the output voltage through the path 670.

The mechanism that the ground voltage Gnd is output as the output voltage when the drain voltage DD is applied to the standard ternary inverter 600 as the input voltage will be described with reference to FIG. 6C.

According to an embodiment, the drain voltage $V_{DD}$ may be applied to the input terminals 611, 612, and 613 of the standard ternary inverter 600. In this case, the first P-MOS transistor 631 of the first type and the third P-MOS transistor of the second type may be turned off. As such, the standard ternary inverter 600 may output the ground voltage Gnd to the output terminal 620 as the output voltage along a path 690 that is formed of the first N-MOS transistor 641, the third N-MOS transistor 652, and the second N-MOS transistor 642.

In detail, the first P-MOS transistor 631 of the first type is turned off when the drain voltage $V_{DD}$ is applied to the input terminal 611, and the third P-MOS transistor 651 of the second type is turned off when the drain voltage $V_{DD}$ is applied to the input terminal 613. In the standard ternary inverter 600, the ground voltage Gnd may be supplied to the source of the second N-MOS transistor 642, and the second P-MOS transistor 632 may act as the high resistance. As a result, when the drain voltage $V_{DD}$ is applied as the input voltage, the standard ternary inverter 600 may output the ground voltage Gnd to the output terminal 620 as the output voltage through the path 690.

Figure 7A:
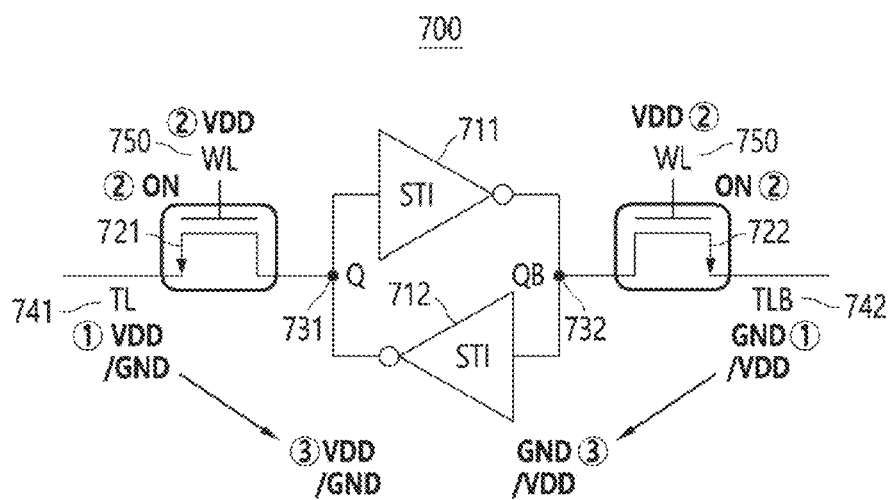
FIGS. 7A and 7B are diagrams for describing the process in which a ternary SRAM cell according to an embodiment performs a write operation.
Figure 7B:
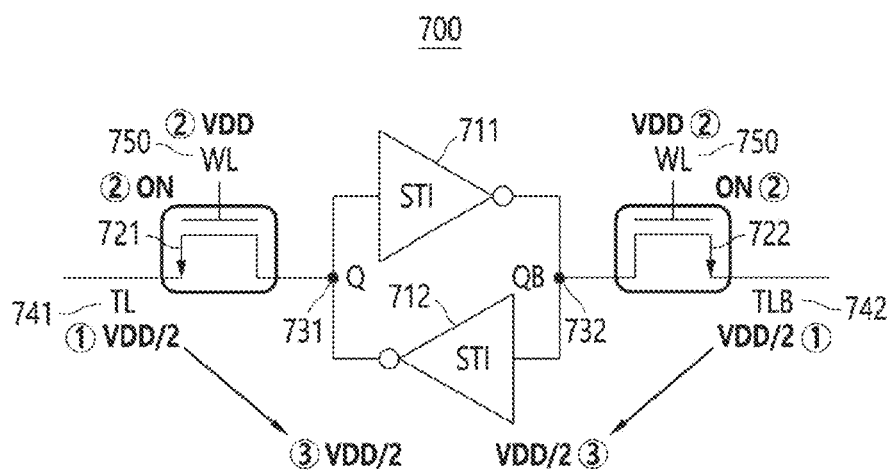

FIGS. 7A and 7B are diagrams for describing the process in which a ternary SRAM cell according to an embodiment performs a write operation.

A ternary SRAM cell 700 according to an embodiment may perform the write operation. In detail, the ternary SRAM cell 700 may hold a voltage indicating a ternary value at a first storage node 731 and a second storage node 732.

According to an embodiment, the ternary SRAM cell 700 may hold a voltage corresponding to one ternary value at each of the first storage node 731 and the second storage node 732 by individually applying a write voltage corresponding to the ternary value at a first treat line 741 and a second treat line 742.

According to an embodiment, a combination of the drain voltage $V_{DD}$ held at the first storage node 731 and the ground voltage Gnd held at the second storage node 732 may indicate a ternary value of "2". Also, a combination of the ground voltage Gnd held at the first storage node 731 and the drain voltage $V_{DD}$ held at the second storage node 732 may indicate a ternary value of "0". In addition, a combination of the half drain voltage $V_{DD}/2$ held at the first storage node 731 and the half drain voltage $V_{DD}/2$ held at the second storage node 732 may indicate a ternary value of "1".

FIG. 7A shows the process in which the ternary SRAM cell 700 holds a voltage indicating "2" or a voltage indicating "0" at the first storage node 731 and the second storage node 732.

According to an embodiment, the drain voltage $V_{DD}$ may be applied to the first treat line 741, and the ground voltage Gnd may be applied to the second treat line 742. The drain voltage $V_{DD}$ may be applied to a word line 750. Because the word line 750 is connected with the gate of a first access transistor 721 and the gate of a second access transistor 722, when the drain voltage $V_{DD}$ is applied to the word line 750, the first access transistor 721 and the second access transistor 722 may be turned on. Also, as the drain voltage $V_{DD}$ applied to the first treat line 741 is transferred to the source of the first access transistor 721, the first storage node 731 may hold the drain voltage $V_{DD}$. As the ground voltage Gnd applied to the second treat line 742 is transferred to the source of the second access transistor 722, the second storage node 732 may hold the ground voltage Gnd.

Also, in the ternary SRAM cell 700, the output terminal of a first standard ternary inverter 711 may be connected with the input terminal of a second standard ternary inverter 712, and the input terminal of the first standard ternary inverter 711 may be connected with the output terminal of the second standard ternary inverter 712. According to the above description, when the drain voltage $V_{DD}$ is applied to the first standard ternary inverter 711, the first standard ternary inverter 711 may output the ground voltage Gnd; when the ground voltage Gnd is applied to the second standard ternary inverter 712, the second standard ternary inverter 712 may output the drain voltage $V_{DD}$. Accordingly, through the positive feedback between the first standard ternary inverter 711 and the second standard ternary inverter 712, the drain voltage $V_{DD}$ of the first storage node 731 may be effectively held, and the ground voltage Gnd of the second storage node 732 may be effectively held. As described above, a combination of the drain voltage $V_{DD}$ held at the first storage node 731 and the ground voltage Gnd held at the second storage node 732 may indicate a ternary value of "2".

According to an embodiment, the ground voltage Gnd may be applied to the first treat line 741, and the drain voltage $V_{DD}$ be applied to the second treat line 742. As the drain voltage $V_{DD}$ is applied to the word line 750, the first access transistor 721 and the second access transistor 722 may be turned on. As the ground voltage Gnd applied to the first treat line 741 is transferred to the source of the first access transistor 721, the first storage node 731 may hold the ground voltage Gnd. As the drain voltage $V_{DD}$ applied to the second treat line 742 is transferred to the source of the second access transistor 722, the second storage node 732 may hold the drain voltage $V_{DD}$. A combination of the ground voltage Gnd held at the first storage node 731 and the drain voltage $V_{DD}$ held at the second storage node 732 may indicate a ternary value of "0".

FIG. 7B shows the process in which the ternary SRAM cell 700 holds a voltage indicating "1" at the first storage node 731 and the second storage node 732.

According to an embodiment, the half drain voltage $V_{DD}/2$ may be applied to the first treat line 741, and the half drain voltage $V_{DD}/2$ may be applied to the second treat line 742. As the drain voltage $V_{DD}$ is applied to the word line 750, the first access transistor 721 and the second access transistor 722 may be turned on. As the half drain voltage $V_{DD}/2$ applied to the first treat line 741 is transferred to the source of the first access transistor 721, the first storage node 731 may hold the half drain voltage $V_{DD}/2$; as the half drain voltage $V_{DD}/2$ applied to the second treat line 742 is transferred to the source of the second access transistor 722, the second storage node 732 may hold the half drain voltage $V_{DD}/2$. A combination of the half drain voltage $V_{DD}/2$ held at the first storage node 731 and the half drain voltage $V_{DD}/2$ held at the second storage node 732 may indicate a ternary value of "1".

Figure 8A:
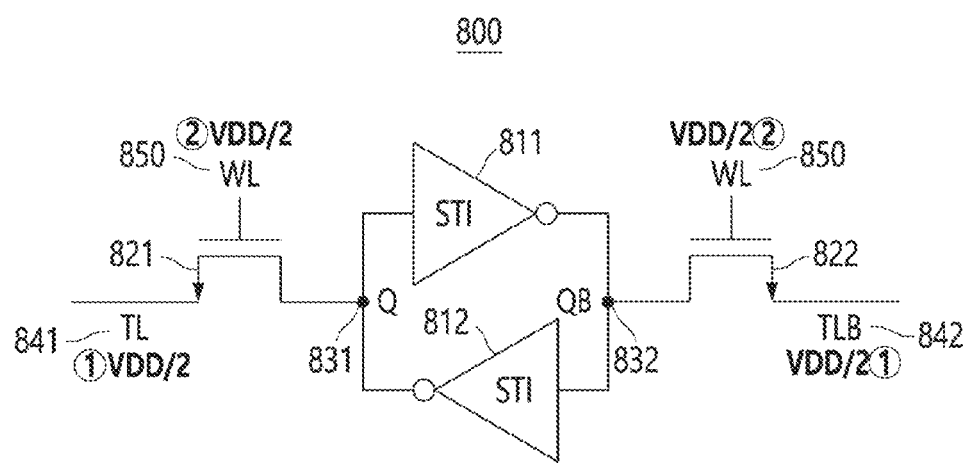
FIGS. 8A and 8B are diagrams for describing the process in which a ternary SRAM cell according to an embodiment perform a read operation.
Figure 8B:
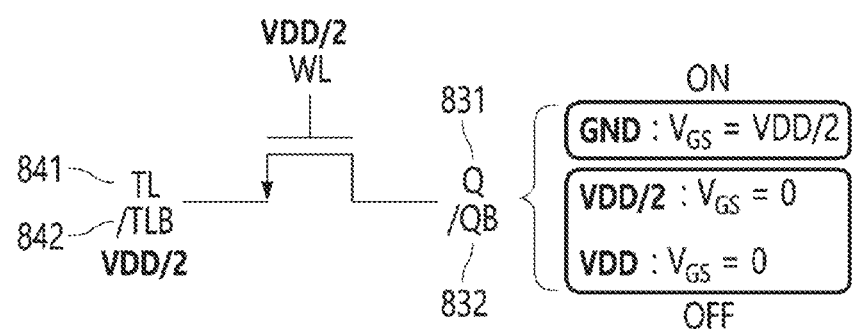

FIGS. 8A and 8B are diagrams for describing the process in which a ternary SRAM cell according to an embodiment may a read operation.

Referring to FIG. 8A, a ternary SRAM cell 800 may hold a voltage indicating one ternary value at a first storage node 831 and a second storage node 832, respectively. For the read operation of the ternary SRAM cell 800, the half drain voltage $V_{DD}/2$ may be applied to a first treat line 841 and a second treat line 842. In other words, the first treat line 841 and the second treat line 842 may be pre-charged with the half drain voltage $V_{DD}/2$. As the half drain voltage $V_{DD}/2$ is applied to a word line 850 instead of the drain voltage $V_{DD}$, the change of the voltages held at the first storage node 831 and the second storage node 832 may be prevented.

According to an embodiment, when the read voltage is individually applied to the first treat line 841 and the second treat line 842 and the ground voltage Gnd is held at at least one of the first storage node 831 and the second storage node 832, the ternary SRAM cell 800 may discharge a treat line corresponding to a node, at which the corresponding ground voltage Gnd is held, to the ground voltage Gnd.

In detail, referring to FIG. 8B, for the turn-on of a first access transistor 821 and a second access transistor 822, a gate threshold voltage VGS should be greater than a threshold voltage Vth. For example, when the ground voltage Gnd is held at the first storage node 831, the first access transistor 821 is turned on; when the half drain voltage $V_{DD}/2$ or the drain voltage $V_{DD}$ is held at the first storage node 831, the first access transistor 821 is turned off. Likewise, when the ground voltage Gnd is held at the second storage node 832, the second access transistor 822 is turned on; when the half drain voltage $V_{DD}/2$ or the drain voltage $V_{DD}$ is held at the second storage node 832, the second access transistor 822 is turned off.

According to an embodiment, when the ground voltage Gnd is held at the first storage node 831, the first access transistor 821 is turned on, and a current flows from the first treat line 841 to the first storage node 831 through the first access transistor 821. The first treat line 841 is discharged to the ground voltage Gnd by the ground voltage Gnd held at the first storage node 831. When the half drain voltage $V_{DD}/2$ or the drain voltage $V_{DD}$ is held at the first storage node 831, the first access transistor 821 is turned off, and thus, the first treat line 841 is not discharged.

According to an embodiment, when the ground voltage Gnd is held at the second storage node 832, the second first access transistor 822 is turned on, and a current flows from the second treat line 842 to the second storage node 832 through the second access transistor 822. The second treat line 842 is discharged to the ground voltage Gnd by the ground voltage Gnd held at the second storage node 832. When the half drain voltage $V_{DD}/2$ or the drain voltage $V_{DD}$ is held at the second storage node 832, the second access transistor 822 is turned off, and thus, the second treat line 842 is not discharged.

To sum up, the first treat line 841 may be discharged only when the ground voltage Gnd is held at the first storage node 831, and the second treat line 842 may be discharged only when the ground voltage Gnd is held at the second storage node 832.

The ternary SRAM cell 800 according to an embodiment may store data corresponding to a ternary value of "2" by holding the drain voltage $V_{DD}$ and the ground voltage Gnd at the first storage node 831 and the second storage node 832, respectively. As such, the second treat line 842 may be discharged to the ground voltage Gnd, and data of "2" may be read depending on the half drain voltage $V_{DD}/2$ output from the first treat line 841 and the ground voltage Gnd output from the second treat line 842.

The ternary SRAM cell 800 according to an embodiment may store data corresponding to a ternary value of "0" by holding the ground voltage VDD and the drain voltage VDD at the first storage node 831 and the second storage node 832, respectively. As such, the first treat line 841 may be discharged to the ground voltage Gnd, and data of "1" may be read depending on the ground voltage Gnd output from the first treat line 841 and the half drain voltage $V_{DD}/2$ output from the second treat line 842.

The ternary SRAM cell 800 according to an embodiment may store data corresponding to a ternary value of "1" by holding the half drain voltage $V_{DD}/2$ and the half drain voltage $V_{DD}/2$ at the first storage node 831 and the second storage node 832, respectively. As such, the first treat line 841 and the second treat line 842 may not be discharged, and data of "1" may be read depending on the half drain voltage $V_{DD}/2$ output from the first treat line 841 and the half drain voltage $V_{DD}/2$ output from the second treat line 842.

Figure 9:
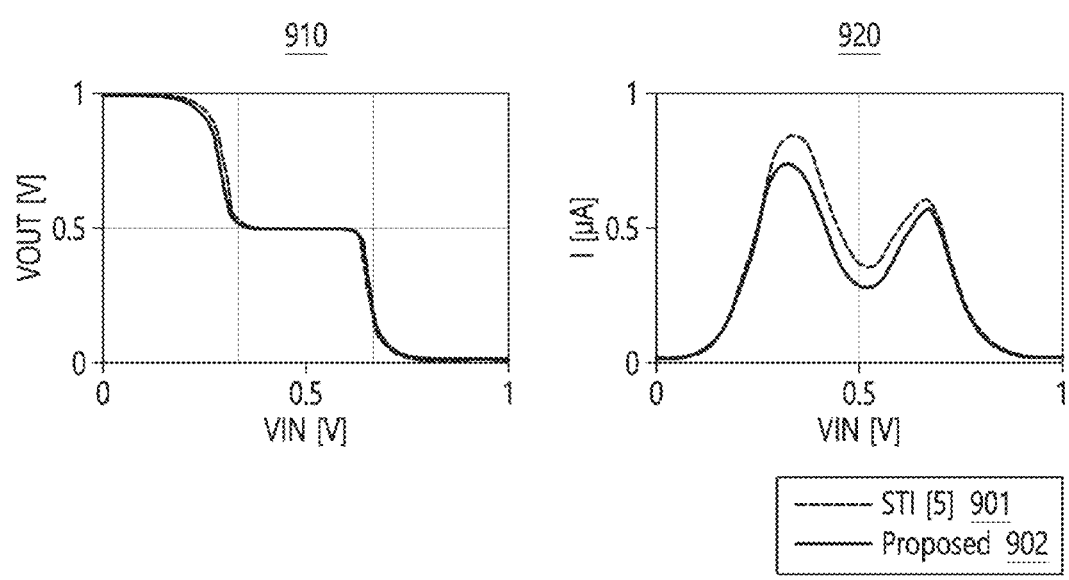
FIG. 9 illustrates a voltage transfer characteristic graph for a standard ternary inverter and a graph for an output voltage according to an input voltage.

FIG. 9 illustrates a voltage transfer characteristic (VTC) graph for a standard ternary inverter and a graph for an output voltage according to an input voltage.

A graph 910 indicates a voltage transfer characteristic of a standard ternary inverter. Referring to FIG. 9, a curve of the voltage transfer characteristic of a standard ternary inverter 901 according to a comparative embodiment and a curve of the voltage transfer characteristic of a standard ternary inverter 902 according to a comparative embodiment are very similar.

A graph 920 indicates an output current according to an input voltage of a standard ternary inverter. Referring to the graph 920, the standard ternary inverter 902 according to an embodiment may output, for example, a current of 1.46 µA when the input voltage is the half drain voltage $V_{DD}/2$ (e.g., 0.5 V), and the standard ternary inverter 901 according to the comparative embodiment may output a current of 1.89 µA when the input voltage is the half drain voltage $V_{DD}/2$. An output current of the standard ternary inverter 902 according to an embodiment may be smaller than that of the standard ternary inverter 901 according to the comparative embodiment as much as 22.75%, and thus, the power dissipation of the standard ternary inverter 902 may be drastically reduced.

Figure 10A:
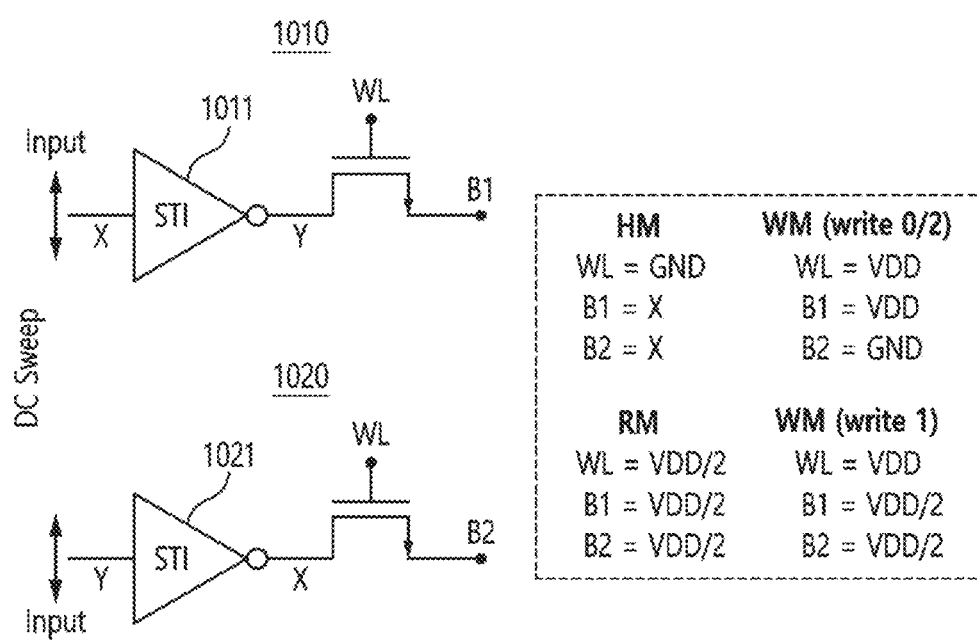
FIG. 10A is a diagram for describing the process of calculating a margin of a ternary SRAM cell according to an embodiment.

FIG. 10A is a diagram for describing the process of calculating a margin of a ternary SRAM cell according to an embodiment.

A ternary SRAM cell according to an embodiment may guarantee the stability of the hold operation, the read operation, and the write operation. First, three SNMs may be measured with respect to the ternary SRAM cell. The three SNMs indicate a hold margin HM, a read margin RM, and a write margin WM. Referring to FIG. 10A, standard ternary inverters 1011 and 1021 may be used to calculate the hold margin HM, the read margin RM, and the write margin WM of the ternary SRAM cell according to an embodiment. A voltage level that is required for each node may be identified. After the voltage level of each node of the ternary SRAM cell is set, the hold margin HM, the read margin RM, and the write margin WM may be measured by using a DC analysis and butterfly curve manner.

Figure 10B:
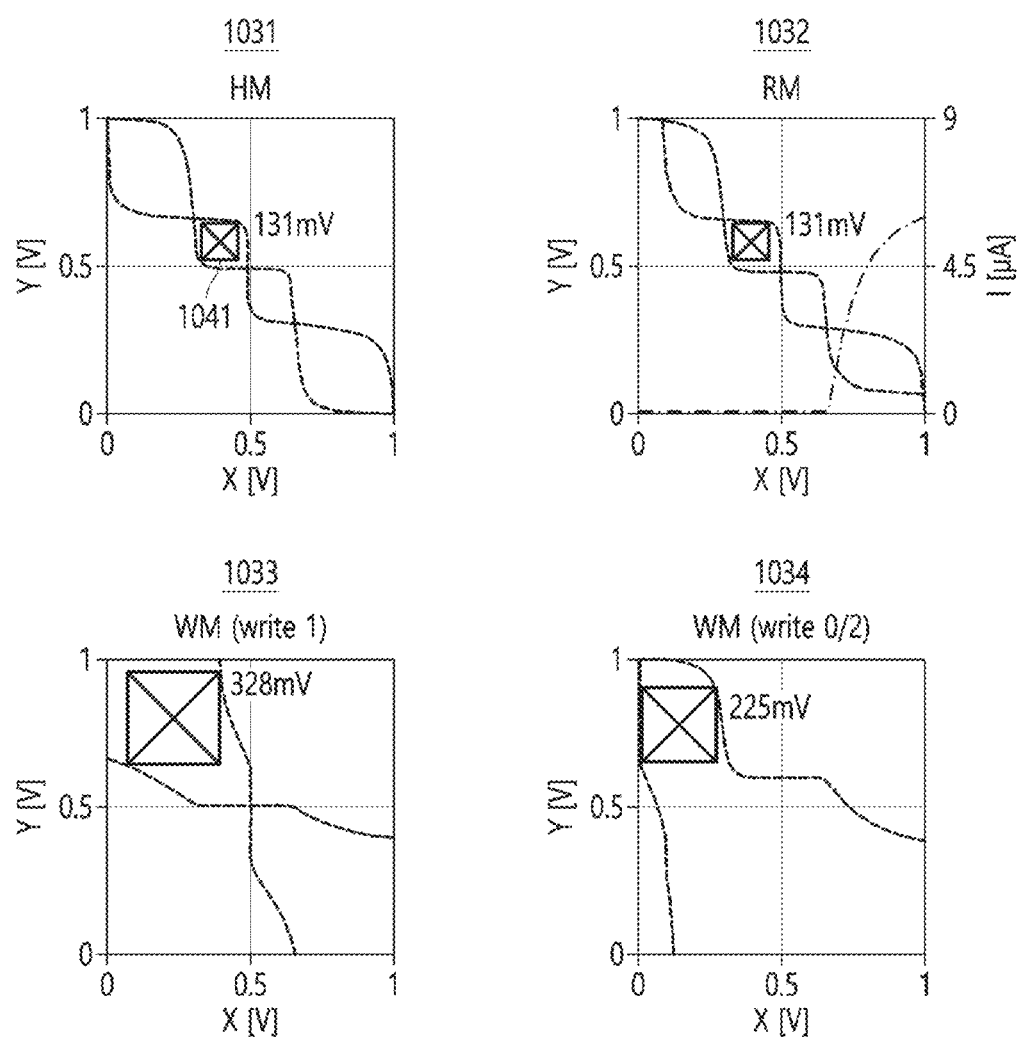
FIG. 10B illustrates a graph for a hold margin, a read margin, and a write margin of a ternary SRAM cell according to an embodiment.

FIG. 10B illustrates a graph for a hold margin, a read margin, and a write margin of a ternary SRAM cell according to an embodiment.

The stability of voltage holding may be identified in the ternary SRAM cell according to an embodiment. In other words, whether a voltage indicating one ternary value is capable of being effectively held at storage nodes of the ternary SRAM cell may be determined through the hold margin. A graph 1031 of FIG. 10B is a graph for calculating a hold margin of a ternary SRAM cell according to an embodiment. In a circuit 1010 of FIG. 10A, the ground voltage Gnd may be applied to a gate of a transistor for the purpose of measuring the hold margin of the ternary SRAM cell. In this case, the output voltage of the output terminal of the standard ternary inverter 1011 may be identified by applying a voltage, which sweeps from the ground voltage Gnd to the drain voltage $V_{DD}$, to the input terminal of the standard ternary inverter 1011. In this case, a graph 1031 may include a curve in which an X value indicates the input voltage applied to the input terminal of the transistor in the circuit 1010 and a Y value indicates the output voltage output from the output terminal of the transistor in the circuit 1010. Also, in the circuit 1020, the ground voltage Gnd may be applied to a gate of a transistor. In this case, the output voltage of the output terminal of the standard ternary inverter 1021 may be identified by applying a voltage, which sweeps from the ground voltage Gnd to the drain voltage $V_{DD}$, to the input terminal of the standard ternary inverter 1021. In this case, the graph 1031 may further include a curve in which a Y value indicates the input voltage applied to the input terminal of the transistor in the circuit 1020 and an X value indicates the output voltage output from the output terminal of the transistor in the circuit 1020. For example, through the graph 1031, the hold margin may be calculated to be 131 mV corresponding to a length of one side of a quadrangle 1041.

As in the above description, there may be calculated the read margin and the write margin of the ternary SRAM cell according to an embodiment. A graph 1032 is a graph for calculating the read margin of the ternary SRAM cell according to an embodiment. For example, through the graph 1032, the read margin may be calculated to be 131 mV. Graphs 1033 and 1034 are graphs for calculating the hold margin of the ternary SRAM cell according to an embodiment. In detail, the graph 1033 is a graph for calculating the write margin when the ternary SRAM cell according to an embodiment stores data corresponding to a ternary value of "1". The graph 1034 is a graph for the write margin when the ternary SRAM cell according to an embodiment stores data corresponding to ternary values of "0" and "2". For example, through the graph 1033, the write margin may be calculated to be 328 mV; through the graph 1034, the write margin may be calculated to be 225 mV. The hold operation and the read operation may have the same noise margin. In the cased of the ternary SRAM cell, because the hold margin and the read margin are the smallest among the tree SNMs, the hold operation and the read operation have the weakest tolerance to the noise.

Figure 11A:
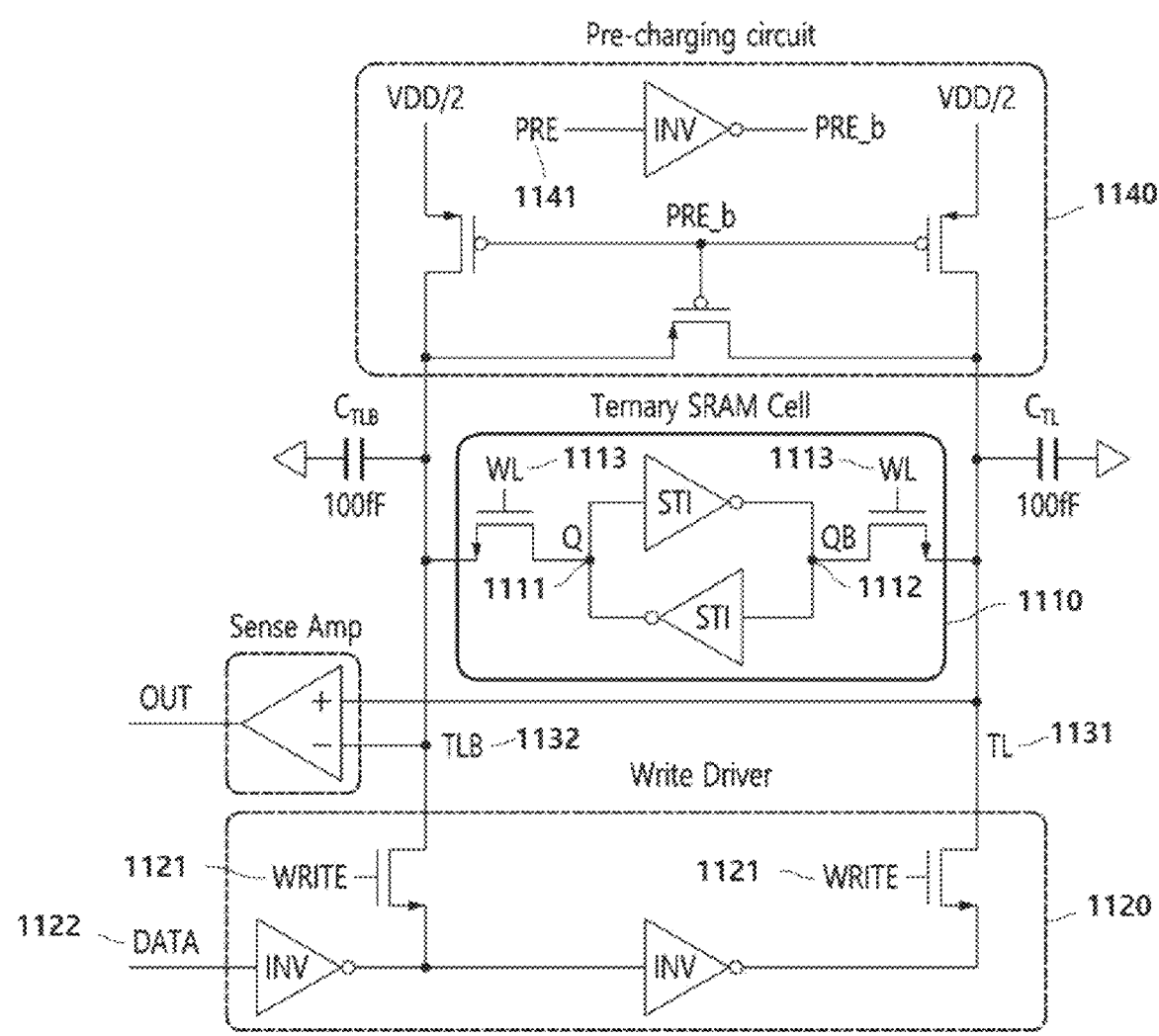
FIGS. 11A and 11B are diagrams for describing simulation results of verifying a read scheme and a write scheme of a ternary SRAM cell according to an embodiment.
Figure 11B:
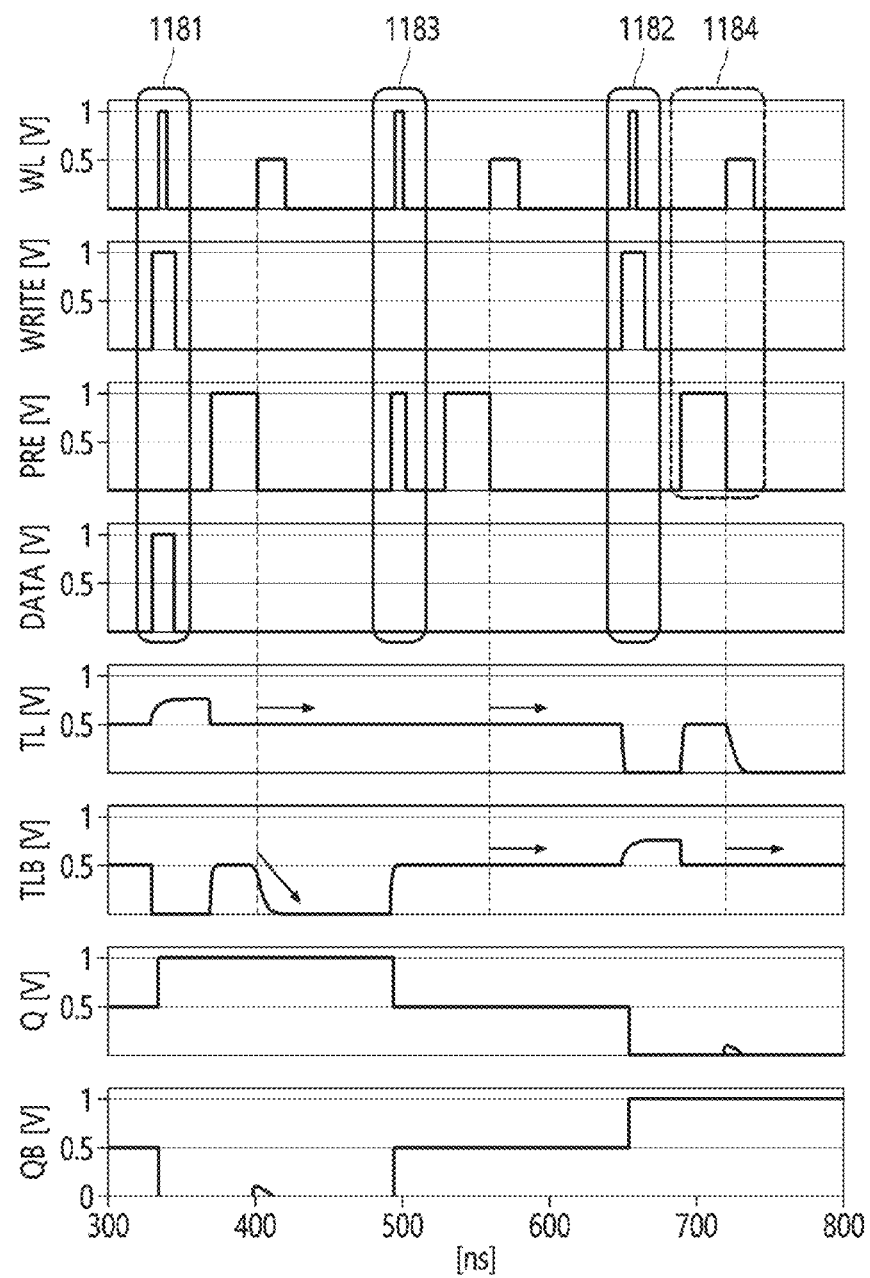

FIGS. 11A and 11B are diagrams for describing simulation results of verifying a read scheme and a write scheme of a ternary SRAM cell according to an embodiment.

FIG. 11A shows a circuit 1100 for performing a read operation and a write operation of a ternary SRAM cell 1110 according to an embodiment. FIG. 11B shows a graph indicating voltages applied or generated every nodes and lines when the read operation and the write operation of the ternary SRAM cell 1110 are performed.

A voltage may be held at a first storage node (Q) 1111 in the order of the drain voltage $V_{DD}$, the half drain voltage $V_{DD}/2$, and the ground voltage Gnd depending on the write scheme.

For example, the process where the ternary SRAM cell 1110 according to an embodiment stores data corresponding to a ternary value of "2" will be described. To allow the first storage node (Q) 111 to hold the drain voltage $V_{DD}$ and a second storage node (QB) 1112 to hold the ground voltage Gnd, the drain voltage $V_{DD}$ may be applied to a node (WRITE) 1121 of a write driver 1120, and the drain voltage $V_{DD}$ may be applied to a node (DATA) 1122; in this case, the drain voltage $V_{DD}$ may be applied to a first treat line 1131, and the ground voltage Gnd may be applied to a second treat line 1132. In this case, the first storage node 1111 may hold the drain voltage $V_{DD}$, and the second storage node 1112 may hold the ground voltage Gnd. The view 1181 of FIG. 11B shows that when the drain voltage $V_{DD}$ (e.g., 1 V) is applied to a word line 1113, the drain voltage $V_{DD}$ (e.g., 1 V) is applied to the node (WRITE) 1121, and the drain voltage $V_{DD}$ (e.g., 1 V) is applied to the node (DATA) 1122, the first storage node (Q) 1111 holds the drain voltage $V_{DD}$, and the second storage node (QB) 1112 holds the ground voltage Gnd.

For another example, the process where the ternary SRAM cell 1110 according to an embodiment stores data corresponding to a ternary value of "0" will be described. To allow the first storage node (Q) 111 to hold the ground voltage Gnd and the second storage node (QB) 1112 to hold the drain voltage $V_{DD}$, the drain voltage $V_{DD}$ may be applied to the node (WRITE) 1121 of the write driver 1120, and the ground voltage Gnd may be applied to the node (DATA) 1122; in this case, the ground voltage Gnd may be applied to the first treat line 1131, and the drain voltage $V_{DD}$ may be applied to the second treat line 1132. In this case, the first storage node 1111 may hold the ground voltage Gnd, and the second storage node 1112 may hold the drain voltage DD. The view 1182 of FIG. 11B shows that when the drain voltage $V_{DD}$ (e.g., 1 V) is applied to the word line 1113, the drain voltage $V_{DD}$ (e.g., 1 V) is applied to the node (WRITE) 1121, and the ground voltage Gnd is applied to the node (DATA) 1122, the first storage node (Q) 1111 holds the ground voltage Gnd, and the second storage node (QB) 1112 holds the drain voltage $V_{DD}$.

For another example, the process where the ternary SRAM cell 1110 according to an embodiment stores data corresponding to a ternary value of "1" will be described. As the drain voltage $V_{DD}$ is applied to a node (PRE) 1141, the half drain voltage $V_{DD}/2$ may be applied to the first treat line 1131 and the second treat at the 1132. In this case, the first storage node 1111 may hold the half drain voltage $V_{DD}/2$, and the second storage node 1112 may also hold the half drain voltage $V_{DD}/2$. The view 1183 of FIG. 11B shows that when the drain voltage $V_{DD}$ (e.g., 1 V) is applied to the word line 1113 and the drain voltage $V_{DD}$ is applied to the node (PRE) 1141, the first storage node (Q) 1111 holds the half drain voltage $V_{DD}/2$, and the second storage node (QB) 1112 holds the half drain voltage $V_{DD}/2$.

In this case, the first storage node 1111 may hold the ground voltage Gnd, and the second storage node 1112 may hold the drain voltage DD.

In addition, to implement the read operation, the drain voltage $V_{DD}$ may be applied to the node (PRE) 1141, and thus, a pre-charging circuit 1140 may be turned on. As described above, the first treat line 1131 and the second treat line 1132 may be pre-charged with the half drain voltage $V_{DD}/2$. Next, the half drain voltage $V_{DD}/2$ may be applied to the word line 1113; in this case, the first treat line 1131 may be discharged when the ground voltage Gnd is held at the first storage node 1111, and the second treat line 1132 may be discharged when the ground voltage Gnd is held at the second storage node 1112. A data value stored in the ternary SRAM cell 1110 may be determined by sensing a voltage difference of the first treat line 1131 and the second treat line 1132. The view 1184 of FIG. 11B shows that when the half drain voltage $V_{DD}/2$ (e.g., 0.5 V) is applied to the word line 1113 and the drain voltage $V_{DD}$ (e.g., 1 V) is applied to the node (PRE) 1141, the first treat line 1131 is discharged to the ground voltage Gnd by the ground voltage Gnd held at the first storage node (Q) 1111.

According to an embodiment of the present disclosure, as an inverter is implemented with transistors having different threshold voltages, power dissipation of a memory cell including the inverter may be reduced, and the reliability of an operation of storing multiple values.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. An inverter comprising:
   a first P-MOS transistor connected between a node receiving a drain voltage and a first path node, and configured to operate based on an input voltage;
   a first N-MOS transistor connected between the first path node and an output terminal outputting an output voltage, and configured to operate based on the drain voltage;
   a second P-MOS transistor connected between the output terminal and a second path node, and configured to operate based on a ground voltage;
   a second N-MOS transistor connected between the second path node and a node receiving the ground voltage, and configured to operate based on the input voltage;

a third P-MOS transistor connected between the first path node and the second path node, and configured to operate based on the input voltage; and
a third N-MOS transistor connected between the first path node and the second path node, and configured to operate based on the input voltage,
wherein the first P-MOS transistor has a first threshold voltage,
wherein each of the second P-MOS transistor and the third P-MOS transistor has a second threshold voltage higher than the first threshold voltage,
wherein the second N-MOS transistor has a third threshold voltage, and
wherein each of the first N-MOS transistor and the third N-MOS transistor has a fourth threshold voltage higher than the third threshold voltage.

2. The inverter of claim 1, wherein the first threshold voltage is identical to the third threshold voltage, and
wherein the second threshold voltage is identical to the fourth threshold voltage.

3. The inverter of claim 1, wherein the third P-MOS transistor includes a source node connected with the first path node and a drain node connected with the second path node, and
wherein the third N-MOS transistor includes a drain node connected with the first path node and a source node connected with the second path node.

4. The inverter of claim 1, wherein the first P-MOS transistor has the first threshold voltage by a gate oxide of a first thickness, and
wherein each of the second P-MOS transistor and the third P-MOS transistor has the second threshold voltage by a gate oxide of a second thickness thicker than the first thickness.

5. The inverter of claim 4, wherein the second N-MOS transistor has the third threshold voltage by a gate oxide of a third thickness, and
wherein each of the first N-MOS transistor and the third N-MOS transistor has the fourth threshold voltage by a gate oxide of a fourth thickness thicker than the third thickness.

6. The inverter of claim 5, wherein the first thickness is identical to the third thickness, and
wherein the second thickness is identical to the fourth thickness.

7. The inverter of claim 1, wherein, when a half drain voltage is applied as the input voltage,
the third P-MOS transistor and the third N-MOS transistor are turned off,
the first P-MOS transistor, the first N-MOS transistor, the second P-MOS transistor, and the second N-MOS transistor are turned on, and
the output voltage is the half drain voltage.

8. The inverter of claim 1, wherein, when the ground voltage is applied as the input voltage,
the second N-MOS transistor and the third N-MOS transistor are turned off,
the first P-MOS transistor, the second P-MOS transistor, and the third P-MOS transistor are turned on, and
the output voltage is the drain voltage.

9. The inverter of claim 1, wherein, when the drain voltage is applied as the input voltage,
the first P-MOS transistor and the third P-MOS transistor are turned off,
the first N-MOS transistor, the second N-MOS transistor, and the third N-MOS transistor are turned on, and
the output voltage is the ground voltage.

10. A memory cell comprising:
a first inverter including an input terminal connected with a first storage node and an output terminal connected with a second storage node;
a second inverter including an output terminal connected with the first storage node and an input terminal connected with the second storage node;
a first access transistor connected between the first storage node and a first treat line; and
a second access transistor connected between the second storage node and a second treat line,
wherein the first inverter includes:
a first P-MOS transistor of a first type connected between a node receiving a drain voltage and a first path node, and configured to operate based on an input voltage input to the input terminal;
a first N-MOS transistor of a second type connected between the first path node and the output terminal outputting an output voltage, and configured to operate based on the drain voltage;
a second P-MOS transistor of the second type connected between the output terminal and a second path node, and configured to operate based on a ground voltage;
a second N-MOS transistor of the first type connected between the second path node and a node receiving the ground voltage, and configured to operate based on the input voltage;
a third P-MOS transistor of the second type connected between the first path node and the second path node, and configured to operate based on the input voltage; and
a third N-MOS transistor of the second type connected between the first path node and the second path node, and configured to operate based on the input voltage,
wherein a first threshold voltage of each of the first P-MOS transistor, the second N-MOS transistor corresponding to the first type is lower than a second threshold voltage of each of the first N-MOS transistor, the second P-MOS transistor, the third P-MOS transistor, and the third N-MOS transistor corresponding to the second type.

11. The memory cell of claim 10, wherein each of the first P-MOS transistor, the second N-MOS transistor corresponding to the first type has the first threshold voltage by a gate oxide of a first thickness, and
wherein each of the first N-MOS transistor, the second P-MOS transistor, the third P-MOS transistor, and the third N-MOS transistor corresponding to the second type has the second threshold voltage by a gate oxide of a second thickness thicker than the first thickness.

12. The memory cell of claim 11, wherein, when a half drain voltage is applied as the input voltage,
the third P-MOS transistor and the third N-MOS transistor are turned off,
the first P-MOS transistor, the first N-MOS transistor, the second P-MOS transistor, and the second N-MOS transistor are turned on, and
the output voltage is the half drain voltage.

13. The memory cell of claim 11, wherein, when the ground voltage is applied as the input voltage,
the second N-MOS transistor and the third N-MOS transistor are turned off,
the first P-MOS transistor, the second P-MOS transistor, and the third P-MOS transistor are turned on, and
the output voltage is the drain voltage.

14. The memory cell of claim 11, wherein, when the drain voltage is applied as the input voltage, the first P-MOS transistor and the third P-MOS transistor are turned off, the first N-MOS transistor, the second N-MOS transistor, and the third N-MOS transistor are turned on, and the output voltage is the ground voltage.

* * * * *